(12) United States Patent
Bacchi et al.

(10) Patent No.: US 6,256,555 B1
(45) Date of Patent: Jul. 3, 2001

(54) ROBOT ARM WITH SPECIMEN EDGE GRIPPING END EFFECTOR

(75) Inventors: Paul Bacchi, Novato; Paul S. Filipski, Greenbrae, both of CA (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 09/204,747

(22) Filed: Dec. 2, 1998

(51) Int. Cl.$^7$ .................................................. G06F 19/00
(52) U.S. Cl. ...................... 700/245; 700/248; 700/249; 700/250; 700/258; 700/259; 700/260; 700/261; 700/262; 700/263; 700/264; 700/900; 74/490.03; 294/8; 291/88; 701/23
(58) Field of Search .................................. 700/245, 258, 700/260, 250, 55, 61, 900, 263, 248, 262, 264, 259, 249; 414/941, 416, 417, 816, 744.3, 744.5, 744.6; 74/490.03; 294/88; 701/23

(56) References Cited

U.S. PATENT DOCUMENTS

| 2,367,991 | 1/1945 | Bailey | 294/34 |
|---|---|---|---|
| 4,024,944 | 5/1977 | Adams et al. | 198/394 |
| 4,410,209 | 10/1983 | Trapani | 294/34 |
| 4,452,480 | 6/1984 | Maier et al. | 294/104 |
| 4,639,028 | 1/1987 | Olson | 294/34 |
| 4,662,811 | 5/1987 | Hayden | 414/433 |
| 4,717,190 | 1/1988 | Witherspoon | 294/99.2 |
| 4,900,214 | 2/1990 | Ben | 414/416 |
| 4,938,600 | 7/1990 | Into | 365/401 |

(List continued on next page.)

FOREIGN PATENT DOCUMENTS

| 0669642 | 8/1995 | (EP) | H01L/21/00 |
|---|---|---|---|
| 0820091 | 1/1998 | (EP) | H01L/21/00 |
| WO 9419821 | 9/1994 | (WO) | H01L/21/00 |
| WO 9744816 | 11/1997 | (WO) | H01L/21/00 |
| 9745861 | 12/1997 | (WO) | H01L/21/00 |
| WO 0003418 | 1/2000 | (WO) | H01L/21/00 |

OTHER PUBLICATIONS

Song et al., Intelligent Rehabilitation Robotic System For The Disabled And The Elderly, IEEE., pp. 2682–2685, 1998.*

Hesselroth et al., Neural Network Control Of A Pneumatic Robot Arm, IEEE., pp. 28–38,1994.*

Primary Examiner—William A. Cuchlinski, Jr.
Assistant Examiner—McDieunel Marc
(74) Attorney, Agent, or Firm—Stoel Rives LLP

(57) ABSTRACT

Robot arm (16) end effectors (10, 110) of this invention rapidly and cleanly transfer between a wafer cassette (14) and a processing station semiconductor wafers (12) having diameters greater than 150 mm. The end effectors include proximal and distal rest pads (24, 26, 124,126) having pad and backstop portions (32, 34, 132, 134) that support and grip the wafer within an annular exclusion zone (30) that extends inward from a peripheral edge (30) of the wafer. An active contact point (50, 150) is movable by a vacuum actuated piston (52, 152) between a retracted wafer-loading position and an extended position that urges the wafer against the distal rest pads to grip the wafer within the exclusion zone. The end effector further includes fiber optic light transmission sensors (90, 102, 202) for locating the wafer periphery and bottom surface (100, 200). The sensors provide robot arm extension and elevation positioning data supporting methods of rapidly and accurately placing and retrieving a wafer from among a stack of closely spaced apart wafers stored in the wafer cassette. The methods effectively prevent accidental contact between the end effector and the wafers while effecting clean, but secure, gripping of the wafer at its edge or within its exclusion zone.

19 Claims, 7 Drawing Sheets

U.S. PATENT DOCUMENTS

| | | | |
|---|---|---|---|
| 5,092,729 | 3/1992 | Yamazaki et al. | 414/225 |
| 5,238,354 | 8/1993 | Volovich | 414/779 |
| 5,332,352 | 7/1994 | Poduje et al. | 414/225 |
| 5,387,067 | 2/1995 | Grunes | 414/217 |
| 5,456,561 | 10/1995 | Poduje et al. | 414/225 |
| 5,511,934 | 4/1996 | Bacchi et al. | 414/783 |
| 5,513,948 | 5/1996 | Bacchi et al. | 414/783 |
| 5,538,385 | 7/1996 | Bacchi et al. | 414/403 |
| 5,669,644 | 9/1997 | Kaihotsu et al. | 294/1.1 |
| 5,697,759 | 12/1997 | Bacchi et al. | 414/786 |
| 5,741,113 * | 4/1998 | Bacchi et al. | 414/744.5 |
| 5,765,444 * | 6/1998 | Bacchi et al. | 74/490.03 |
| 5,870,488 | 2/1999 | Rush et al. | 382/151 |
| 5,944,476 * | 8/1999 | Bacchi et al. | 414/783 |
| 5,980,188 * | 11/1999 | Ko et al. | 414/417 |
| 6,098,484 * | 8/2000 | Bacchi et al. | 74/490.03 |
| 6,105,454 * | 8/2000 | Bacchi et al. | 74/490.03 |

* cited by examiner

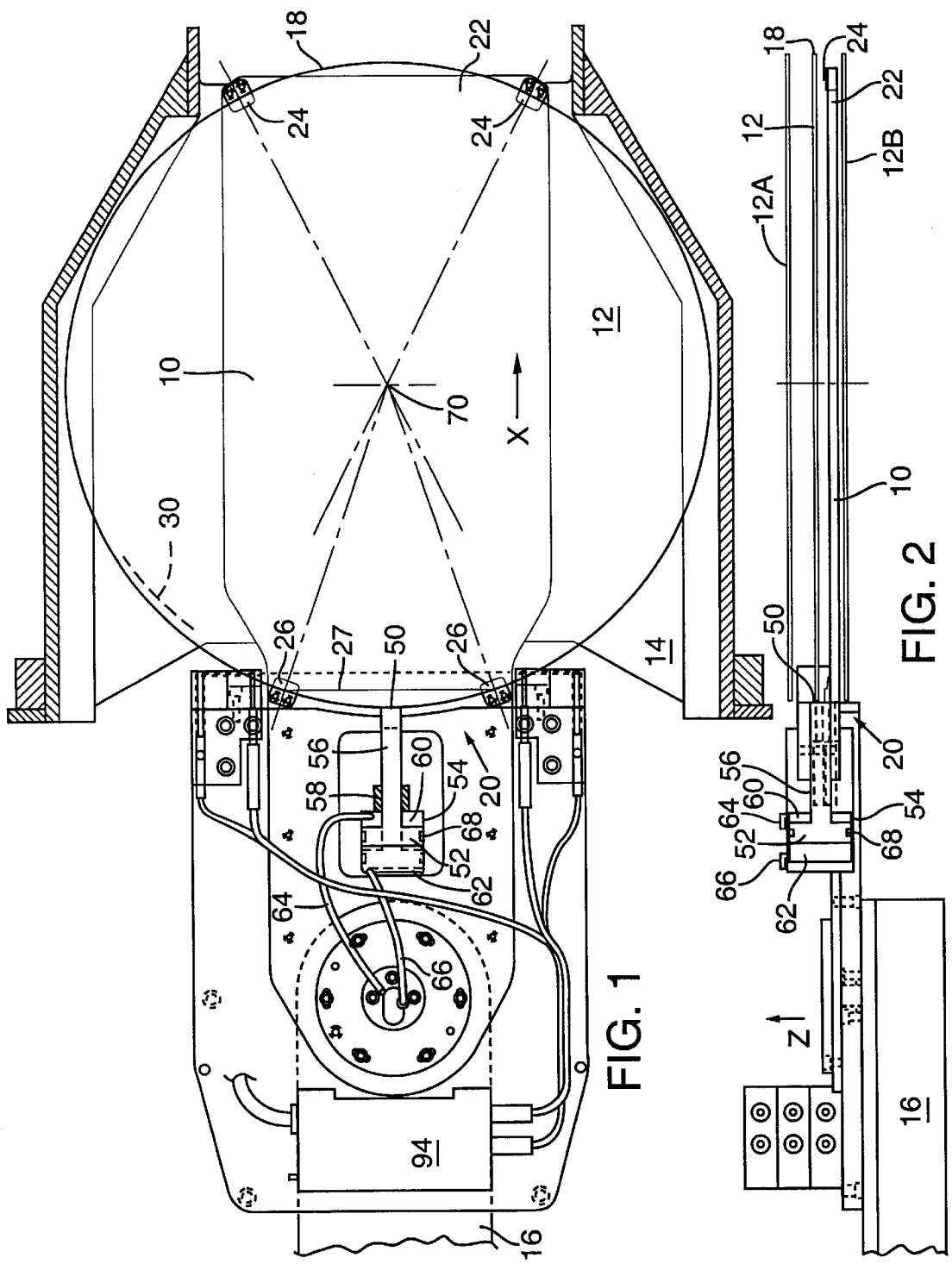

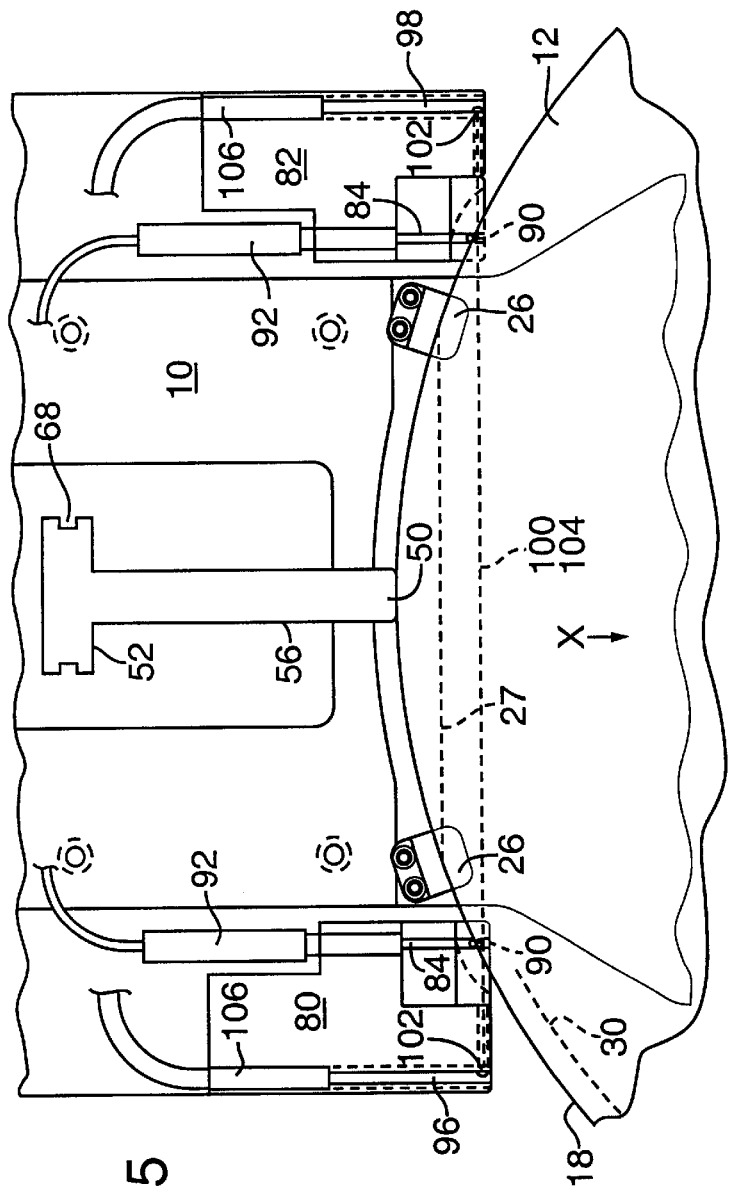
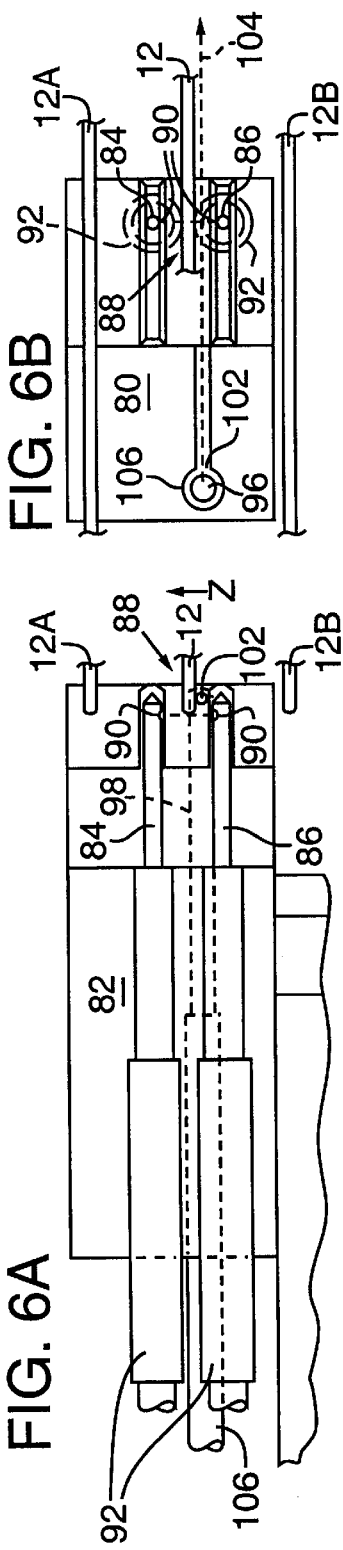
FIG. 5
FIG. 6A
FIG. 6B

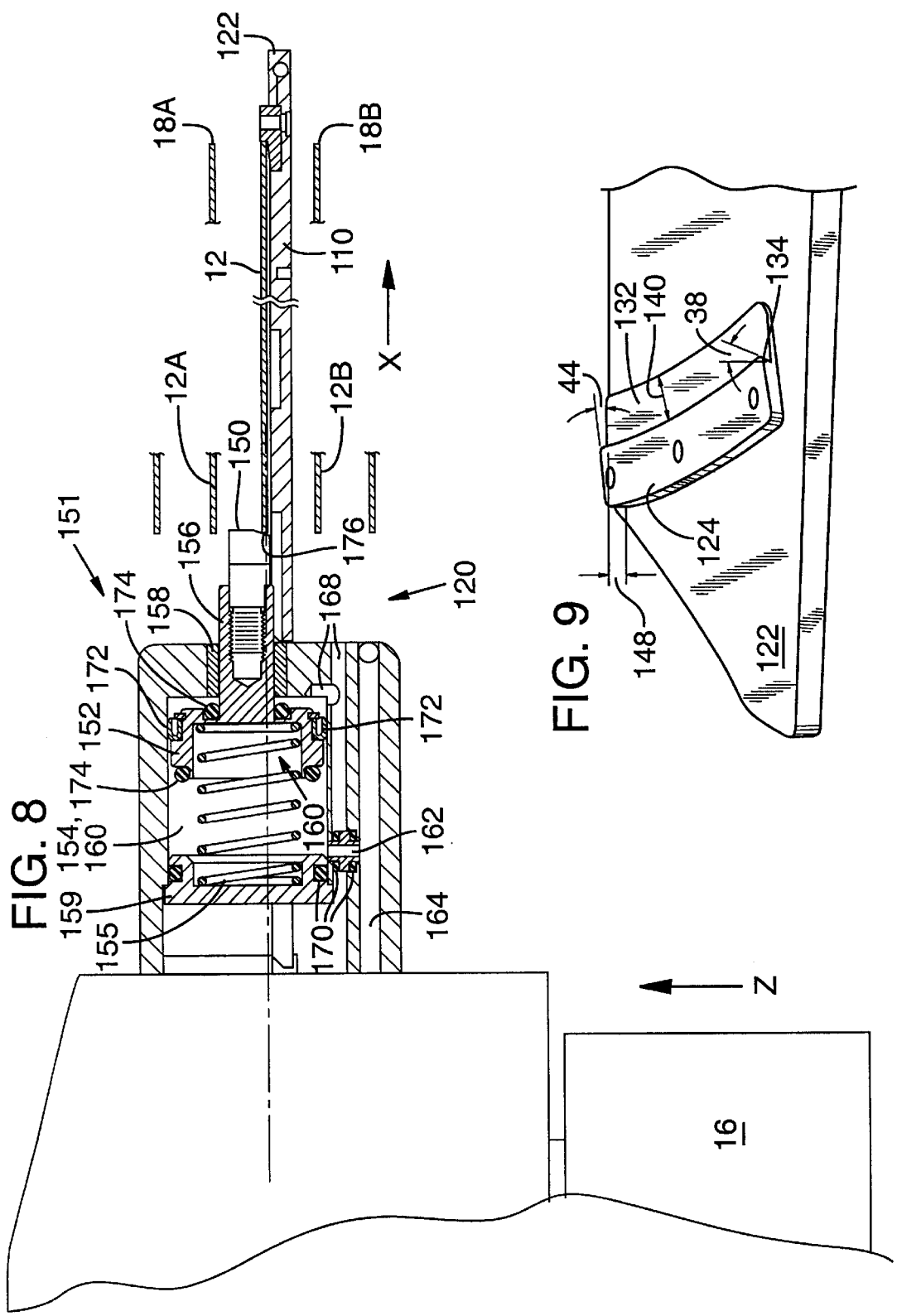

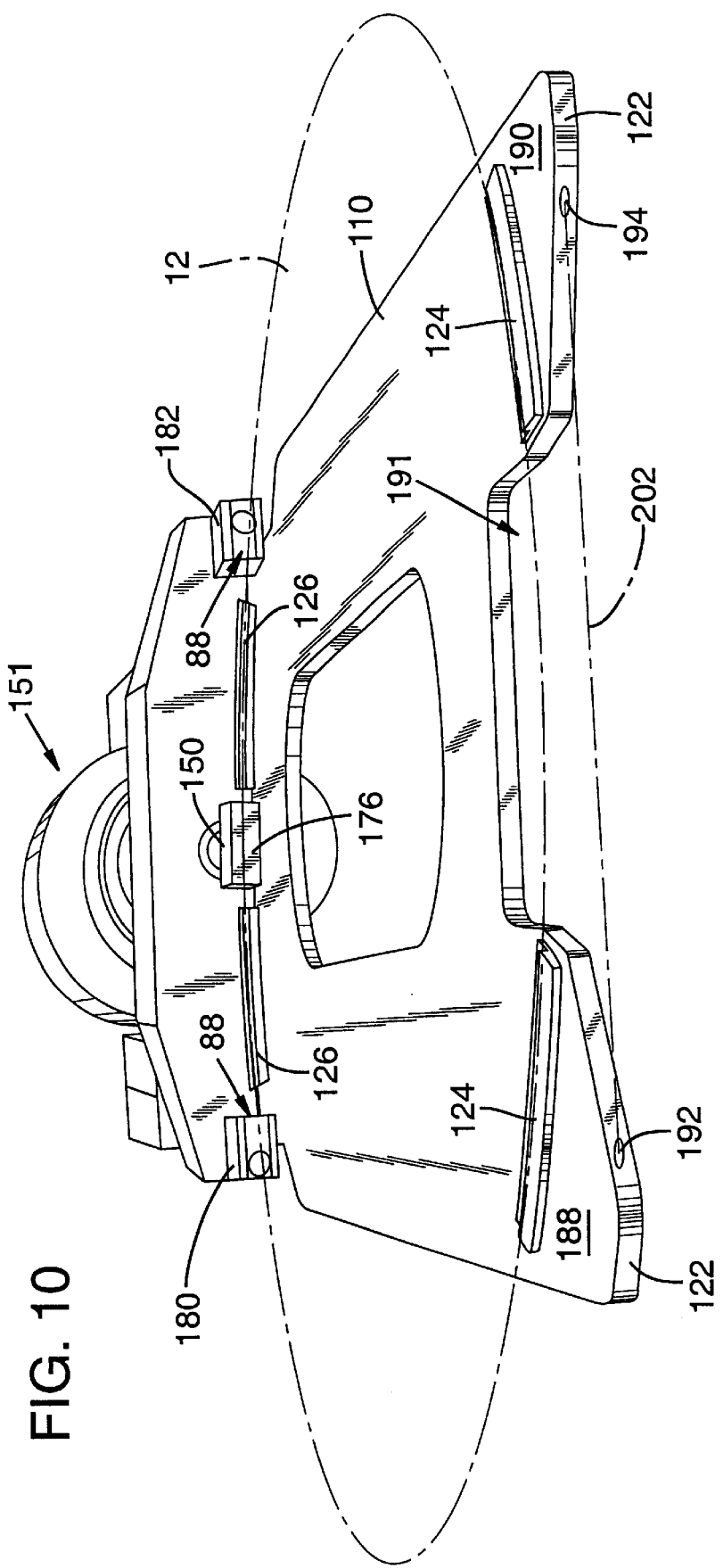

ROBOT ARM WITH SPECIMEN EDGE GRIPPING END EFFECTOR

FIELD OF THE INVENTION

This invention is directed to a specimen handling apparatus and method and, more particularly, to an edge gripping semiconductor wafer robot arm end effector that substantially reduces wafer backside damage and particulate contamination.

BACKGROUND OF THE INVENTION

Integrated circuits are produced from wafers of semiconductor material. The wafers are typically housed in a cassette having a plurality of closely spaced apart slots, each of which can contain a wafer. The cassette is typically moved to a processing station where the wafers are removed from the cassette, placed in a predetermined orientation by a prealigner or otherwise processed, and returned to the cassette, or another cassette, for moving to another location for further processing.

Various types of wafer handling devices are known for transporting the wafers to and from the cassette and among processing stations. Many employ a robotic arm having a spatula-shaped end that is inserted into the cassette to remove or insert a wafer. The end of the robotic arm is referred to as an end effector that typically employs a vacuum to releasably hold the wafer to the end effector. The end effector typically enters the cassette through the narrow gap between a pair of adjacent wafers and engages the backside of a wafer to retrieve it from the cassette. The end effector must be thin, rigid, and positionable with high accuracy to fit between and not touch the closely spaced apart wafers in the cassette. After the wafer has been processed the robotic arm inserts the wafer back into the cassette.

Unfortunately, transferring the wafer among the cassette, robot arm, and processing stations, such as a prealigner, may cause backside damage to the wafer and contamination of the other wafers in the cassette because intentional engagement as well as inadvertent touching of the wafer may dislodge silicon particles that can fall and settle onto the other wafers. Wafer backside damage can include scratches as well as metallic and organic contamination of the wafer material. Robotic arms and prealigners that employ a vacuum to grip the wafer do minimize backside damage and particle creation. Nevertheless, when handling large wafers having small features, even the few particles created are sufficient to contaminate adjacent wafers housed in the cassette. Reducing such contamination is particularly important to maintaining wafer processing yields, which is particularly true for large wafers.

Furthermore, robotic arms and prealigners that grip a wafer with a vacuum have heretofore been limited to handling wafers having diameters smaller than 200 millimeters ("mm"). Semiconductor production systems may soon utilize 300 mm diameter wafers, with larger diameter wafers under consideration. Robot arms and prealigners employing vacuum gripping may be incapable of securely handling these larger wafers quickly and accurately. Because increasing semiconductor yield "is the name of the game, " it is important to grip such larger wafers securely so they can be prealigned quickly and accurately while minimizing wafer backside damage and particulate contamination.

What is needed, therefore, is a specimen gripping end effector that can securely, quickly, and, accurately transfer 150 mm diameter and larger semiconductor wafers to and from a cassette while minimizing backside damage and silicon particle contamination.

SUMMARY OF THE INVENTION

It is an object of this invention, therefore, to provide a specimen handling device that minimizes specimen damage and the production of silicon particles.

It is a further object of this invention to provide a semiconductor wafer handling device that can quickly and accurately transfer 150 mm diameter and larger wafers between a wafer cassette and a wafer processing station.

It is still another object of this invention to reduce contamination of semiconductor wafers housed within a cassette.

Yet another object of this invention is to provide a wafer handling device that can be retrofit to existing robot arm systems.

Robot arm end effectors of this invention rapidly and cleanly transfer 150 mm and larger diameter semiconductor wafers between a wafer cassette and a processing station. The end effectors include at least one proximal rest pad and at least two distal rest pads having pad and backstop portions that support and grip the wafer within an annular exclusion zone that extends inward from the peripheral edge of the wafer. The end effectors also include an active contact point that is movable between a retracted wafer-loading position and an extended wafer-gripping position. The active contact point is movable to urge the wafer against the distal rest pads so that the wafer is gripped only at its edge or within the exclusion zone.

The end effectors are spatula-shaped and have a proximal end that is operably connected to a robot arm. The active contact point is located at the proximal end, which allows the end effector to be lighter, stronger, and more slender than end effectors having moving mechanisms that may not fit between adjacent wafers in a cassette. The lack of moving mechanisms further causes the end effector to produce less contamination within the cassette. Additionally, locating the active contact point at the proximal end of the end effector ensures that it is remote from harsh conditions such as heated environments and liquids.

A vacuum pressure-actuated piston moves the active contact point between a retracted position, in which the wafer is loaded into the end effector, and an extended position in which the wafer is gripped. The vacuum pressure assists in the elimination of particles to maintain a clean environment. A first embodiment of the piston employs vacuum pressure to move the active contact point between both positions, and a second embodiment of the piston employs vacuum pressure to retract the active contact point and a spring to extend the active contact point.

Alternate embodiments of the end effector include flat or inclined, narrow or arcuate rest pads onto which the wafer is initially loaded. The narrow and arcuate inclined rest pad embodiments assist in centering and gripping the wafer between the active contact point and the distal rest pads. The arcuate rest pads more readily accommodate gripping and handling flatted wafers.

The end effectors further include fiber optic light transmission sensors for accurately locating the wafer edge and bottom surface. Alternate embodiments of the sensors place the bottom surface sensors and respective proximal and distal ends of the end effector. In both embodiments, the sensors provide robot arm extension and elevation positioning data that support methods of rapidly and accurately placing and retrieving a wafer from among a stack of closely spaced apart wafers stored in a wafer cassette. The methods effectively prevent accidental contact between the end effector and the wafers in the cassette while effecting clean, but secure, gripping of the wafer within its exclusion zone.

Additional objects and advantages of this invention will be apparent from the following detailed description of preferred embodiments thereof which proceed with reference to the accompanying drawings.

BRIEF DESCRIPTION OF THE DRAWINGS

FIG. 1 is a plan view of a first embodiment of the end effector of this invention shown inserted into a semiconductor wafer cassette to retrieve or replace a wafer.

FIG. 2 is a side elevation view of the end effector of FIG. 1 without the wafer cassette but showing the end effector inserted between an adjacent pair of three closely spaced apart wafers as they would be stored in the cassette.

FIG. 5 is a fragmentary plan view of a portion of the end effector and wafer of FIG. 1, enlarged to reveal positional relationships among the wafer and a movable contact point, wafer rest pads, and wafer edge and elevation sensors of the first embodiment end effector of this invention.

FIGS. 6A and 6B are respective side and front elevation views of one of the edge and elevation sensors of FIG. 5, further enlarged to reveal the positioning of fiber optic light paths relative to the wafer.

FIG. 8 is a sectional side elevation view of the end effector of FIG. 7 showing a preferred active contact point actuating mechanism gripping a wafer between adjacent ones of closely spaced apart wafers as they would be stored in the wafer cassette.

FIG. 9 is an enlarged isometric view of a distal arcuate rest pad embodiment of this invention mounted on the distal end of the end effector of FIG. 7.

FIG. 10 is an end perspective view of the end effector of FIG. 7 showing positional relationships among the movable contact point, arcuate rest pads, and wafer edge and elevation sensors of the second embodiment end effector of this invention.

DETAILED DESCRIPTION OF PREFERRED EMBODIMENTS

Figure 3:
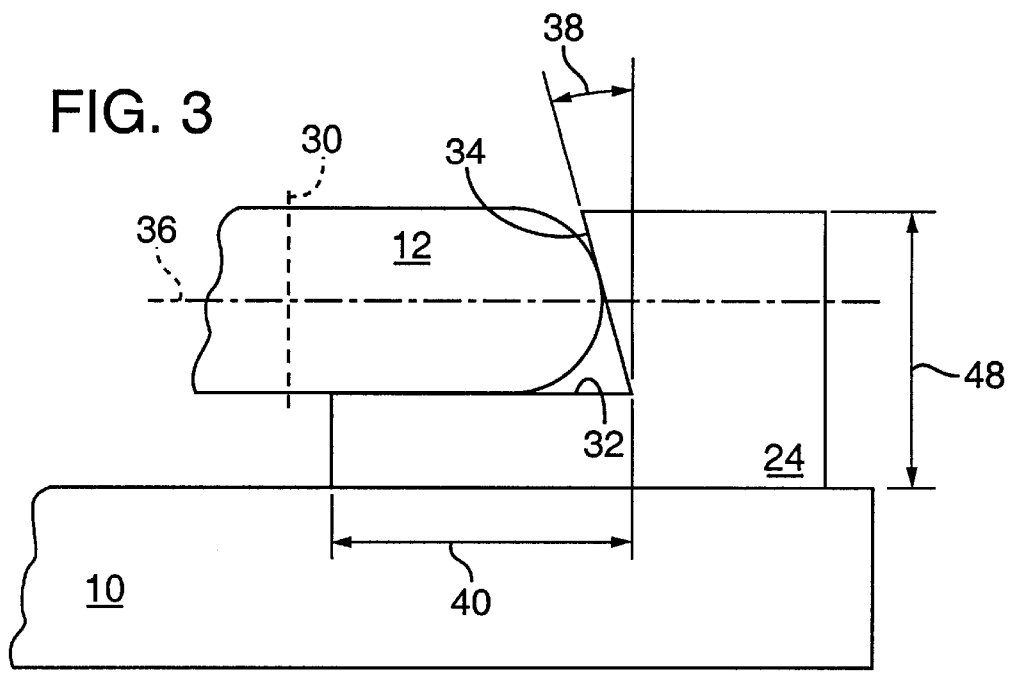
FIG. 3 is an enlarged side elevation view of a flat rest pad embodiment of this invention showing the rest pad engaging an exclusion zone of a wafer.

FIGS. 1 and 2 show a first embodiment of a spatula-shaped end effector 10 of this invention for transferring semiconductor wafers, such as a wafer 12 (shown transparent to reveal underlying structures), to and from a wafer cassette 14. End effector 10 is adapted to receive and securely hold wafer 12 and transfer it to and from cassette 14 for processing. FIG. 2 shows that end effector 10 is particularly adapted for retrieving and replacing wafer 12 from among closely spaced apart wafers, such as wafers 12, 12A, and 12B, which are shown as they might be stacked in wafer cassette 14. Wafers having diameters of less than 150 mm are typically spaced apart at a 4.76 mm (³⁄₁₆ inch) pitch distance, 200 mm diameter wafers are typically spaced apart at a 6.35 mm (³⁄₁₆ inch) pitch distance, and 300 mm wafers are typically spaced apart at a 10 mm (0.394 inch) pitch distance.

End effector 10 is operably attached to a robot arm 16 (a portion of which is shown) that is programmably positionable in a well known manner. In general, end effector 10 enters wafer cassette 14 to retrieve wafer 12 positioned between wafers 12A and 12B. End effector 10 is then finely positioned by robot arm 16 and actuated to grip a periphery 18 of wafer 12, remove wafer 12 from cassette 14, and transfer wafer 12 to a processing station (not shown) for processing. End effector 10 may then, if necessary, reinsert wafer 12 into cassette 14, release wafer 12, and withdraw from cassette 14.

End effector 10 is operably coupled to robot arm 16 at a proximal end 20 and extends to a distal end 22. End effector 10 receives wafer 12 between proximal end 20 and distal end 22 and includes at least two and, preferably, four rest pads upon which wafer 12 is initially loaded. Two distal rest pads 24 are located at, or adjacent to, distal end 22 of end effector 10, and at least one, but preferably two proximal rest pads 26 are located toward proximal end 20. Distal rest pads 24 may alternatively be formed as a single arcuate rest pad having an angular extent greater than the length of a "flat," which is a grain orientation indicating feature commonly found on semiconductor wafers. A flat 27 is shown, by way of example only, positioned between proximal rest pads 26. Of course, wafer 12 may have a different orientation, so periphery 18 is also shown positioned between proximal rest pads 26.

Wafer 12 includes an exclusion zone 30 (a portion of which is shown in dashed lines). Semiconductor wafers have an annular exclusion zone, or inactive portion, that extends inwardly about 1 mm to about 5 mm from periphery 18 and completely surrounding wafer 12. Exclusion zone 30 is described as part of an industry standard wafer edge profile template in SEMI (Semiconductor Equipment and Materials International) specification M10298, pages 18 and 19. As a general rule, no part of end effector 10 may contact wafer 12 beyond the inner boundary of exclusion zone 30. It is anticipated that future versions of the specification may allow edge contact only, a requirement that is readily accommodated by this invention.

The distance between rest pads 24 and the distance between rest pads 26 each have an angular extent greater than any feature on wafer 12 to guarantee that wafer 12 is gripped only within exclusion zone 30. Rest pads 24 and 26 may be made of various materials, but a preferred material is polyetheretherkeytone ("peek"), which is a semi-crystalline high temperature thermoplastic manufactured by Ensinger Engineering Plastics located in Washington, Pennsylvania. The rest pad material may be changed to adapt to different working environments, such as in high temperature applications.

FIG. 3 shows a substantially flat embodiment of distal rest pads 24 that is suitable for use with wafers having less than about a 200 mm diameter. Distal rest pads 24 include a pad portion 32 and a backstop portion 34. In the flat embodiment, pad portion 32 is substantially parallel to an imaginary plane 36 extending through wafer 12, and backstop portion 36 is inclined toward wafer 12 at a backstop angle 38 of up to about 5 degrees relative to a line perpendicular to plane 36. Alternatively, pad portion 32 may be inclined away from wafer 12 up to about 3 degrees relative to plane 36. Pad portion 32 has a length 40 that is a function of the depth of exclusion zone 30, but is preferably about 3 mm long. Wafer 12 typically has a substantially rounded peripheral edge and contacts rest pads 24 only within exclusion zone 30. Wafer 12 is gripped by urging it into the included angle formed between pad portion 32 and backstop portion 34.

Figure 4:
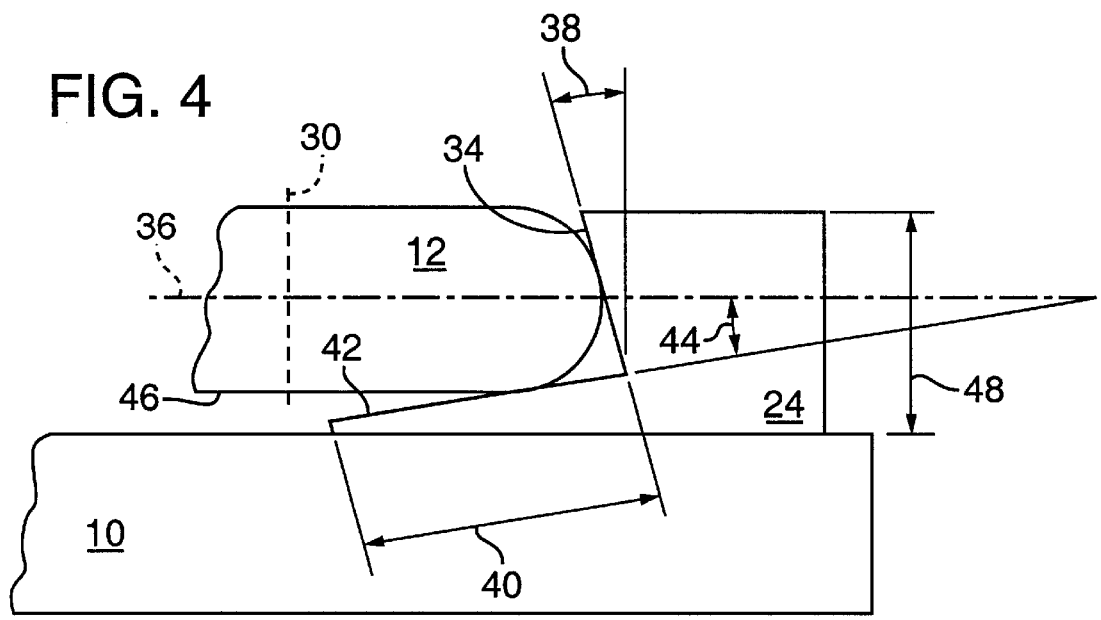
FIG. 4 is an enlarged side elevation view of an inclined rest pad embodiment of this invention showing the inclined rest pad engaging substantially a periphery of a wafer.

FIG. 4 shows an inclined embodiment of distal rest pads 24 that is suitable for use with wafers having greater than about a 200 mm diameter, and preferably about a 300 mm or larger diameter. Of course, this invention may also be used for smaller diameter wafers. Distal rest pads 24 include an inclined pad portion 42 and a backstop portion 34. In the inclined embodiment, inclined pad portion 42 is inclined away from wafer 12 at a rest pad angle 44 of about 3 degrees relative to plane 36, and backstop portion 36 is inclined toward wafer 12 at backstop angle 38 of up to about 3 degrees. Inclined pad portion 42 has a length 40 that is a function of the depth of exclusion zone 30, but is preferably about 3 mm long. As before, wafer 12 typically has a substantially rounded peripheral edge and contacts rest pads 24 only within exclusion zone 30. Wafer 12 is gripped by urging it into the included angle formed between pad portion 42 and backstop portion 34. In the inclined embodiment, there is substantially no contact between rest pad 24 and a bottom surface 46 of wafer 12. This rest pad embodiment is also suitable for wafer edge contact only.

Both the flat and inclined embodiments of distal rest pads 24 have a height 48 that substantially reaches but does not extend beyond the top surface of wafer 12.

Referring again to FIG. 1, proximal rest pads 26 are similar to distal rest pads 24 except that each rest pad 26 does not necessarily require a backstop portion and its pad portion has a length of about twice that of length 40.

End effector 10 further includes an active contact point 50 that is located at proximal end 20 of end effector 10 and between proximal rest pads 26. Active contact point 50 is movable between a retracted wafer-loading position (shown in dashed lines) and an extended wafer-gripping position (shown in solid lines).

Active contact point 50 is operatively connected to a piston 52 for reciprocation between the retracted and extended positions. In a first embodiment, piston 52 reciprocates within a bore 54 and is preferably vacuum pressure operated to extend and retract active contact point 50. Active contact point 50 is connected to piston 52 by a piston rod 56 that extends through an airtight seal 58. Bore 54 forms a vacuum chamber in end effector 10 that is divided by piston 52 into a drive chamber 60 and a return chamber 62. Drive chamber 60 is in pneumatic communication with a vacuum pressure source (not shown) through a first channel 64, and return chamber 62 is in pneumatic communication with the vacuum pressure source through a second channel 66. The vacuum pressure acts through drive chamber 60 against the front face of piston 52 to extend active contact point 50 to the wafer-gripping position and acts through return chamber 62 against the back face of piston 52 to retract active contact point 50 as controlled by the programmable control. The vacuum pressure source is routed to first and second channels 64 and 66 through rotary vacuum communication spools in robot arm 16. Preferred rotary vacuum communication spools are described in U.S. Pat. No. 5,741,113 for CONTINUOUSLY ROTATABLE MULTIPLE LINK ROBOT ARM MECHANISM, which is assigned to the assignee of this application.

Piston 52 further includes an annular groove 68 that is in pneumatic communication with a vent (not shown) in piston rod 56. First and second channels 64 and 66 are connected respectively to drive chamber 60 and return chamber 62 at locations that are opened to groove 68 at the travel limits of piston 52. Therefore, vacuum pressure in first and second channels 64 and 66 is reduced at the travel limits of piston 52, thereby providing signals to the vacuum controller that active contact point 50 is fully extended or retracted to effect proper loading of wafer 12.

After wafer 12 is loaded onto end effector 10, active contact point 50 is actuated to move wafer 12 into its gripped position. As active contact point 50 is extended, it urges wafer 12 toward distal rest pads 24 until wafer 12 is gripped within exclusion zone 30 by active contact point 50 and distal rest pads 24.

Proximal rest pads 26 are arranged relative to distal rest pads 24 so that plane 36 of wafer 12 is preferably parallel to end effector 10 when gripped. This arrangement is readily achieved when the flat embodiment of proximal and distal rest pads 24 and 26 is employed. However, when the inclined embodiment is employed, proximal and distal rest pads 24 and 26 are arranged such that the points where wafer 12 contacts pad portions 42 are substantially equidistant from a center 70 of wafer 12 when active contact point 50 is extended and wafer 12 is gripped. For example, when wafer 12 is in the position shown in FIG. 1, the pad portions of distal and proximal rest pads 24 and 26 contact wafer 12 at points tangent to periphery 18 such that a line through the center of each pad portion 42 intersects center 70 of wafer 12.

The location of active contact point 50 at proximal end 20 allows end effector 10 to be lighter, stronger, and more slender than end effectors having moving mechanisms that may not fit between adjacent wafers 12, 12A, and 12B in cassette 14. The lack of moving mechanisms further causes end effector 10 to produce less contamination within cassette 14. Additionally, locating active contact point 50 at proximal end 20 of end effector 10 ensures that active contact point 50 is remote from harsh conditions such as heated environments and liquids.

The close spacing of adjacent wafers 12, 12A, and 12B requires accurate positioning of end effector 10 to enter cassette 14 and positively grip the wafers without touching adjacent wafers.

FIGS. 5, 6A, and 6B show respective top, side, and front views of a first embodiment of wafer edge and elevation sensors that provide accurate wafer 12 positioning data relative to end effector 10. (Wafer 12 is shown transparent to reveal underlying structures.) The sensors are housed in first and second sensor housings 80 and 82, which together form three light transmission sensors, each having a fiber optic source/receiver pair.

Two wafer edge sensors are implemented as follows. First and second sensor housings 80 and 82 each include a light source fiber 84 and a light receiver fiber 86 that form between them a small U-shaped opening 88 into which periphery 18 of wafer 12 can fit. Fibers 84 and 86 further include mutually facing light path openings 90 that form a narrow light transmission pathway for detecting the presence or absence of periphery 18 of wafer 12. Fibers 84 and 86 extend through ferrules 92 to a light source/receiver module 94 that is mounted on a convenient location of end effector 10 near its rotary connection to robot arm 16. Light source/receiver module 94 conventionally detects degrees of light transmission between fibers 84 and 86 and, thereby, accurately senses the positioning of periphery 18 between light path openings 90. Of course, the relative positions of fibers 84 and 86 may be reversed.

One elevation sensor is implemented as follows. First sensor housing 80 further includes a light source fiber 96 (shown in phantom), and second sensor housing 82 includes a light receiver fiber 98 (shown in phantom). Fibers 96 and 98 form between them a wide opening that sights along a bottom surface chord 100 of wafer 12. Fibers 96 and 98 further include mutually facing light path openings 102 that form a narrow light transmission pathway 104 for detecting the presence or absence of bottom surface chord 100 of wafer 12. Fibers 96 and 98 extend through ferrules 106 to light source/receiver module 94. Light source/receiver module 94 conventionally detects degrees of light transmission between fibers 96 and 98 and thereby accurately senses the positioning of bottom surface chord 100 between light path openings 102. Of course, the relative positions of fibers 96 and 98 may be reversed.

Flat 27 may be detected by separating light path openings 102 from each other by distance greater than the length of flat 27. Flat 27 is present if bottom surface chord 100 is sensed between light path openings 102, but periphery 18 is not sensed between one of the pairs of light path openings 90.

The procedure by which end effector 10 accesses wafer 12 of a known diameter, such as 200 mm, is described below with reference to FIGS. 2, 5, 6A, and 6B.

Active contact point 50 is placed in its retracted position.

End effector 10 is inserted in an X direction into cassette 14 between, for example, wafers 12 and 12B, until periphery 18 is sensed between at least one pair of light path openings 90.

A controller (not shown) associated with robot arm 16 records the extension of robot arm 16 when periphery 18 is sensed, ignoring any sensed flat.

End effector 10 is retracted in the –X direction by an amount sufficient to provide clearance between wafer 12 and the edge detectors.

Robot arm 16 is moved in a Z direction until bottom surface chord 100 of wafer 12 is sensed.

The controller records the Z elevation of the bottom surface of wafer 12.

The controller computes the X distance required to reach into cassette 14 at a Z elevation below the bottom surface of wafer 12 so distal and proximal rest pads 24 and 26 clear wafers 12 and 12B.

The controller also accounts for:
1) a radial distance offset and an elevation distance offset of distal rest pads 24 relative to the Z elevation of light transmission pathway 104, and
2) the radial distance end effector 10 was retracted after sensing periphery 18.

The controller moves end effector 10 in the X direction into cassette 14 and elevates in the Z direction to contact wafer 12 on landing pads 24 and 26.

Active contact point 50 is actuated to urge wafer 12 into the included angle between pad and backstop portions 32 and 34 of distal rest pads 24, thereby gripping wafer 12.

End effector 10 withdraws wafer 12 in the –X direction from cassette 14.

Figure 7:
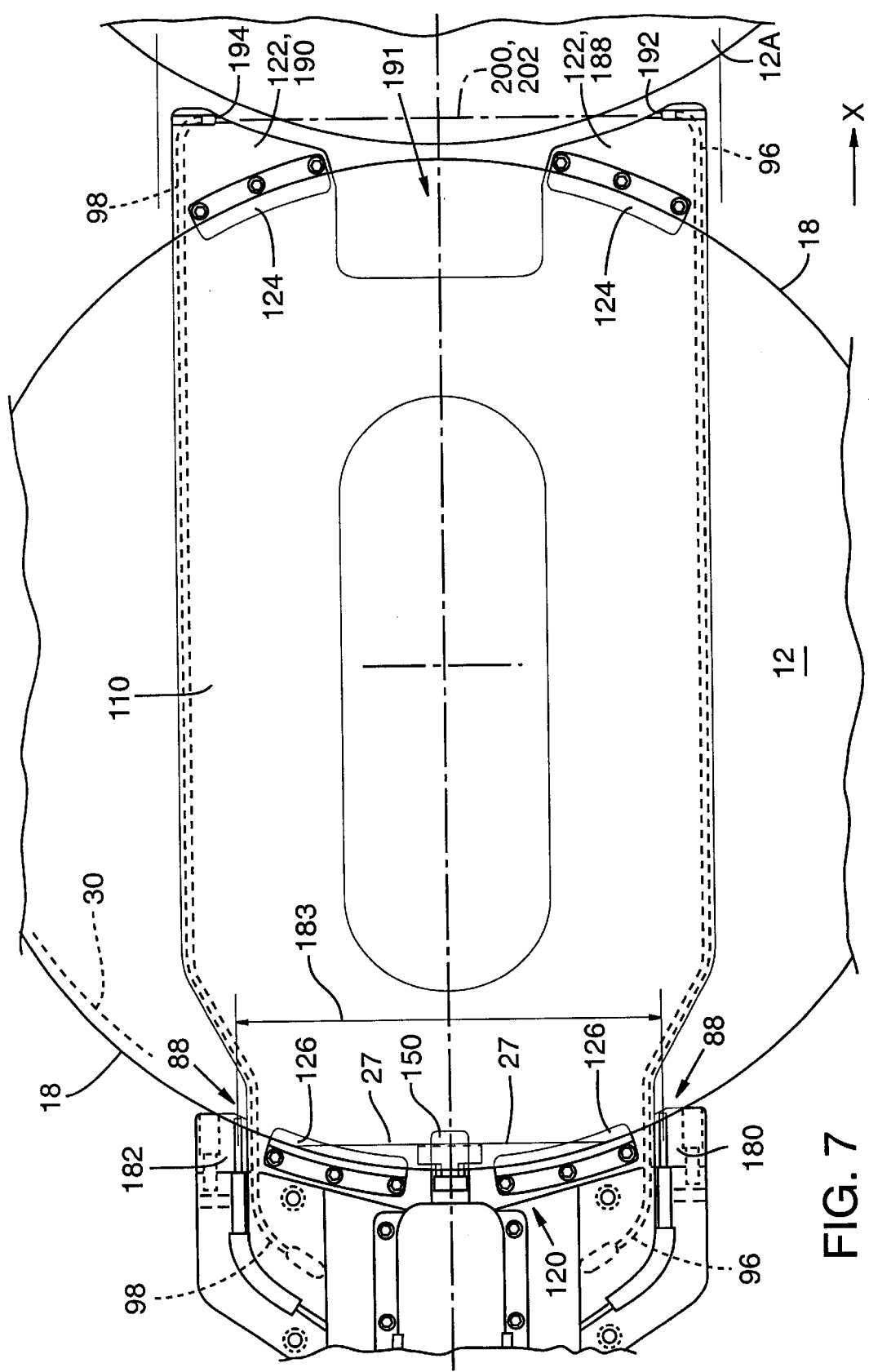
FIG. 7 is a plan view of a second embodiment of the end effector of this invention shown gripping a semiconductor wafer and adjacent to a semiconductor wafer in a wafer cassette to sense, retrieve, or replace a wafer.

FIGS. 7 and 8 show a second embodiment of a spatula-shaped end effector 110 of this invention for transferring semiconductor wafers, such as wafer 12 (shown transparent to reveal underlying structures), to and from wafer cassette 14 (not shown in this view). End effector 110 is similar to end effector 10 but is further adapted to sense the bottom surface of a wafer stored in wafer cassette 14 without protruding into the cassette. FIG. 8 shows that end effector 110 is particularly adapted for retrieving and replacing wafer 12 from among closely spaced apart wafers, such as wafers 12, 12A, and 12B, which are shown as they might be stacked in wafer cassette 14.

End effector 110 is operably attached to robot arm 16. In general, end effector 110 senses the bottom surface of wafer 12 before entering wafer cassette 14 to retrieve wafer 12 from between wafers 12A and 12B. End effector 110 is then finely positioned by robot arm 16 and actuated to grip periphery 18 of wafer 12, remove wafer 12 from cassette 14, and transfer wafer 12 to a processing station (not shown) for processing. End effector 110 may then, if necessary, reinsert wafer 12 into cassette 14, release wafer 12, and withdraw from cassette 14.

End effector 110 is operably coupled to robot arm 16 at a proximal end 120 and extends to a distal end 122. End effector 110 receives wafer 12 between proximal end 120 and distal end 122 and includes at least two and, preferably, four arcuate rest pads upon which wafer 12 is initially loaded. Two distal arcuate rest pads 124 are located at, or adjacent to, distal end 122 of end effector 110; and at least one, but preferably two proximal arcuate rest pads 126 are located toward proximal end 120. Distal and proximal arcuate rest pads 124 and 126 may have an angular extent greater than flat 27, which is shown, by way of example only, positioned between proximal rest pads 126. Of course, wafer 12 may have a different orientation from that shown.

Arcuate rest pads 124 and 126, whether separated as shown, or joined into a single rest pad, have an angular extent greater than any feature on wafer 12 to guarantee that wafer 12 is sufficiently gripped, whether flatted or not, and only within exclusion zone 30. Like rest pads 24 and 26, rest pads 124 and 126 may be made of various materials, but the preferred material is peek.

FIG. 9 shows the embodiment of distal arcuate rest pads 124 that is suitable for use with flatted or nonflatted wafers having greater than about a 200 mm diameter, and preferably a 300 mm or larger diameter. Of course, this invention may also be used for smaller or larger diameter wafers. Distal arcuate rest pads 124 include an inclined pad portion 132 and a backstop portion 134. Referring also to FIG. 4, inclined pad portion 132 is inclined away from wafer 12 at rest pad angle 44 of about 3 degrees relative to plane 36, and backstop portion 136 is inclined toward wafer 12 at backstop angle 38 of up to about 3 degrees. Inclined pad portion 132 has a length 140 that is a function of the depth of exclusion zone 30, but is preferably about 3 mm long. As before, wafer 12 typically has a substantially rounded peripheral edge and contacts arcuate rest pads 124 only within exclusion zone 30. Of course, the peripheral edge need not be rounded. Wafer 12 is gripped by urging it into the included angle formed between inclined pad portion 132 and backstop portion 134. This arcuate rest pad embodiment is also suitable for wafer edge contact only.

Distal arcuate rest pads 124 have a height 148 that substantially reaches but does not extend beyond the top surface of wafer 12.

Referring again to FIG. 7, proximal arcuate rest pads 126 are similar to distal arcuate rest pads 124 except that each rest pad 126 does not necessarily require a backstop portion and its pad portion has a length of about twice that of length 140.

End effector 110 further includes an active contact point 150 that is located at proximal end 120 of end effector 110 and between proximal arcuate rest pads 126. Active contact point 150 is movable between a retracted wafer-loading position (not shown) and the extended wafer-gripping position shown.

Referring again to FIG. 8, a preferred embodiment of an active contact point actuating mechanism 151 is shown employed with end effector 110. Active contact point 150 is operatively connected to a piston 152 for reciprocation between retracted and extended positions. In this embodiment, piston 152 reciprocates within a bore 154 and is urged by a spring 155 to extend active contact point and by a vacuum pressure to retract active contact point 150. Active contact point 150 is connected to piston 152 by a piston rod 156 that extends through an annular airtight seal 158. Bore 154 includes an end cap 159 that forms one wall of a vacuum chamber 160, the other wall of which is movably formed by piston 152. Vacuum chamber 160 is in pneumatic communication with a vacuum pressure source (not shown) through a vacuum feedthrough 162 and a vacuum channel 164. Spring 155 presses against the face of piston 152 to extend active contact point 150 to the wafer-gripping position, whereas the vacuum pressure acts through vacuum chamber 160 against the face of piston 152 to overcome the spring force and retract active contact point 150 to the wafer-releasing position.

In this embodiment, active contact point 150 is urged against wafer 12 with a force determined solely by spring 155. Spring 155 is supported between recesses 166 in piston 152 and end cap 159. The vacuum pressure source is routed to vacuum channel 164 through rotary vacuum communication seals or spools in robot arm 16.

Actuating mechanism 151 further includes a vent 168 in pneumatic communication with the atmosphere to allow free movement of piston 152 within the portion of bore 154 not in pneumatic communication with the vacuum pressure source. Actuating mechanism is made "vacuum tight" by O-ring seals 170 surrounding end cap 159 and vacuum feedthrough 162 and by an annular moving seal 172 surrounding piston 152. O-ring bumper seals 174 fitted to the faces of piston 152 absorb contact shocks potentially encountered by piston 152 at the extreme ends of its travel.

After wafer 12 is loaded onto end effector 110, active contact point 150 is actuated to move wafer 12 into its gripped position. As active contact point 150 is extended by spring 155, it urges wafer 12 toward distal arcuate rest pads 124 until wafer 12 is gripped within exclusion zone 30 by active contact point 150 and distal arcuate rest pads 124. Active contact point 150 includes an inwardly inclined face portion 176 that urges wafer 12 toward proximal arcuate rest pads 126, thereby firmly gripping exclusion zone 30 of wafer 12.

Proximal arcuate rest pads 126 are arranged relative to distal arcuate rest pads 124 so that the plane of wafer 12 is preferably parallel to end effector 110 when gripped.

In a manner similar to end effector 10, the location of active contact point 150 at proximal end 120 allows end effector 110 to be lighter, stronger, and more slender than end effectors having moving mechanisms that may not fit between adjacent wafers 12, 12A, and 12B in cassette 14. The lack of moving mechanisms between its proximal and distal ends further causes end effector 110 to produce less contamination within cassette 14. Moreover, unlike end effector 10, which is actuated by two vacuum lines, end effector 100 requires only one vacuum line for actuation. Of course, end effector 10 could be fitted with actuating mechanism 151.

The close spacing of adjacent wafers 12, 12A, and 12B requires accurate positioning of end effector 110 to enter cassette 14 and positively grip the wafers without touching adjacent wafers.

Figure 11:
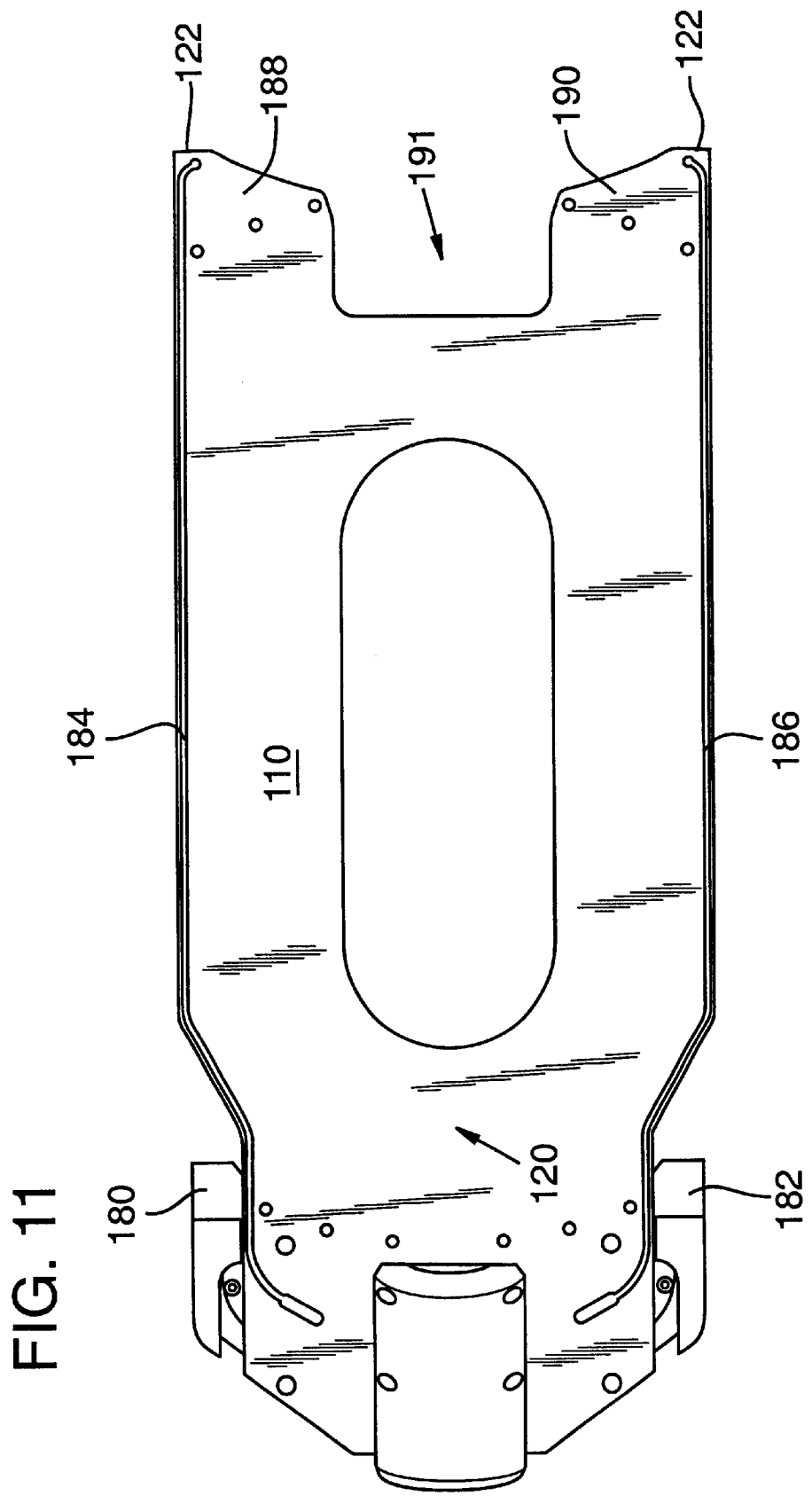
FIG. 11 is a bottom view of the end effector of FIG. 7 showing fiber optic routing channels for elevation sensors of the second embodiment end effector of this invention.

FIGS. 7, 10, and 11 show respective top, end, and bottom views of a second embodiment of wafer edge and elevation sensors that provide accurate wafer 12 positioning data relative to end effector 110. The wafer edge sensors are housed in first and second sensor housings 180 and 182, each having a fiber optic source/receiver pair forming a light transmission sensor in each housing. The elevation sensor is housed in distal end 122 of end effector 110.

Two wafer edge sensors are implemented as follows. First and second sensor housings 180 and 182 each include light source fiber 84 and light receiver fiber 86, as in end effector 10, that form between them a small U-shaped opening 88 into which periphery 18 of wafer 12 can fit. As before, fibers 84 and 86 include mutually facing light path openings that form a narrow light transmission pathway for detecting the presence or absence of periphery 18 of wafer 12. The two wafer edge sensors are separated from each other by a distance 183 greater than the length of flat 27 so that a flatted wafer can be detected when only one of the two wafer edge sensors detects periphery 18 of wafer 12. Of course, wafer 12 must be appropriately oriented in cassette 14 to detect flat 27.

The elevation sensor is implemented as follows. Unlike the first embodiment, first and second sensor housings 180 and 182 do not include light source fiber 96 light receiver fiber 98. Rather in this embodiment, light source fiber 96 is routed through a first channel 184 formed in the bottom surface of end effector 110 and running between proximal end 120 and a first distal tine 188 proximal to distal end 122 of end effector 110. In like manner, light receiver fiber 98 is routed through a second channel 186 formed in the bottom surface of end effector 110 and running between proximal end 120 and a second distal tine 190 proximal to distal end 122 of end effector 110. Distal tines 188 and 190 are widely spaced apart across a gap 191 that forms a relief region for certain types of processing equipment, such as wafer pre-aligners.

Fibers 96 and 98 terminate in mutually facing light path openings 192 and 194 formed in distal tines 188 and 190. Fibers 96 and 98 form between them a wide opening that sights along a bottom surface chord 200 of, for example, wafer 12A. Mutually facing light path openings 192 and 194 form a narrow light transmission pathway 202 for detecting the presence or absence of bottom surface chord 200 of wafer 12A. In end effector 110, light transmission pathway 202 extends beyond the portion of distal end 122 that would first contact wafer 12, thereby further providing an obstruction sensing capability. As before, light source/receiver module 94 conventionally detects degrees of light transmission between fibers 96 and 98 and, thereby, accurately senses the positioning of bottom surface chord 200 between light path openings 192 and 194. Of course, the relative positions of fibers 96 and 98 may be reversed.

The procedure by which end effector 110 accesses a predetermined wafer from among closely spaced apart wafers in a cassette, is described below with reference to FIGS. 7, 8, and 10.

Active contact point 150 is placed in its retracted position.

End effector 110 is moved in an X direction toward cassette 14 until tines 188 and 190 are adjacent to, but not touching, a predicted position for any wafer 12 in cassette 14.

End effector 110 is then scanned in a Z direction such that light transmission pathway 202 intersects the bottom surface chord 200 of any wafer in cassette 14 and, additionally, detects any obstruction projecting from cassette 14 toward end effector 110.

The controller (not shown) records the Z elevations of the bottom surfaces of any wafers and obstructions detected.

Robot arm 16 is moved to a Z elevation calculated to access a predetermined wafer, such as wafer 12A, while also providing clearance for end effector 110 between adjacent wafers.

The following optional operations may be performed:

End effector 110 may be optionally moved in an X direction toward cassette 14 until tines 188 and 190 are adjacent to, but not touching, wafer 12A. In this position, light transmission pathway 202 should be adjacent to bottom surface chord 200 of wafer 12A;

robot arm 16 is optionally moved in a Z direction until bottom surface chord 200 of wafer 12A is sensed;

the controller optionally verifies the previously sensed Z elevation of the bottom surface of wafer 12A; and robot arm 16 is optionally moved in a −Z direction to provide clearance for end effector 110 between adjacent wafers.

End effector 110 is inserted in an X direction into cassette 14 between adjacent wafers until periphery 18 is sensed between at least one wafer edge sensor.

The controller moves end effector 10 in the Z direction calculated to contact wafer 12A on landing pads 124 and 126.

Active contact point 150 is actuated to urge wafer 12A into the included angle between pad and backstop portions 132 and 134 of distal arcuate rest pads 124, thereby gripping wafer 12A. (In FIG. 7, the gripped wafer is shown as wafer 12.)

End effector 110 withdraws wafer 12A in the −X direction from cassette 14.

End effector 110 combines a very thin Z-direction profile and accurate wafer position sensing to enable clean, rapid, and secure movement of very closely spaced apart wafers in a cassette.

The above-described embodiments are merely illustrative of the principles of the invention. Various modifications and changes may be made thereto by those skilled in the art that will embody the principles of the invention and fall within the spirit and scope thereof. For example, skilled workers will understand that the pistons may be actuated by alternative power sources, such as, for example, by a pulsing solenoid that slows the pistons as wafer 12 is secured. Electric signals may be employed to drive and monitor the positioning of the pistons. The pistons may also be pneumatically operated and monitored, such as in applications where the end effectors are submerged in a liquid. Moreover, the end effectors may be forked or otherwise include a cutout or be shaped to avoid obstacles, such as a prealigner hub. Finally, the end effector is usable for handling various types of specimens other than semiconductor wafers, such as compact diskettes and computer memory discs.

It will be further obvious to those having skill in the art that many changes may be made to the details of the above-described embodiments of this invention without departing from the underlying principles thereof. The scope of the present invention should, therefore, be determined only by the following claims.

We claim:

1. A robotic arm end effector apparatus for gripping a specimen by its peripheral edge, comprising:

a body having a proximal end attached to the robotic arm and an opposed distal end;

at least one distal rest pad attached to the distal end of the body and having a pad portion for supporting the peripheral edge of the specimen and a backstop portion that forms with the pad portion an included angle for gripping the peripheral edge of the specimen;

at least one proximal rest pad coupled to the proximal end of the body for supporting the peripheral edge of the specimen; and a proximal end active contact point movable between a retracted specimen-loading position and an extended specimen-gripping position in which the peripheral edge of the specimen is urged into the included angle formed in the distal rest pad.

2. The apparatus of claim 1 in which the proximal end active contact point is formed as part of the proximal rest pad.

3. The apparatus of claim 1 in which the active contact point is operably connected to a vacuum-actuated piston mounted for reciprocation within a bore associated with the proximal end of the body.

4. The apparatus of claim 1 in which the distal rest pad has a generally arcuate shape that conforms to an angular range of the periphery of the specimen.

5. The apparatus of claim 1 further comprising two distal rest pads.

6. The apparatus of claim 1 in which the backstop portion is inclined at a backstop angle of less than about 5 degrees with respect to a line perpendicular to a plane passing through the specimen.

7. The apparatus of claim 1 in which the pad portion is inclined at a rest pad angle of less than about 5 degrees with respect to a plane passing through the specimen to limit a contact area within an exclusion zone of the specimen.

8. The apparatus of claim 1 in which the robotic arm moves the end effector in an X direction and the end effector further includes at least one edge sensor for determining an X direction position of the end effector relative to the peripheral edge of the specimen.

9. The apparatus of claim 8 in which the edge sensor includes a fiber optic light emitter closely spaced apart from a fiber optic light receiver to form therebetween a light path extending across a plane of the specimen for detecting the peripheral edge of the specimen.

10. The apparatus of claim 1 in which the robotic arm moves the end effector in a Z direction and the end effector further includes an elevation sensor for determining a Z direction position of the end effector relative to a major surface of the specimen.

11. The apparatus of claim 10 in which the elevation sensor includes a fiber optic light emitter spaced apart from a fiber optic light receiver to form therebetween a light path extending substantially parallel to a plane of the specimen for detecting the major surface of the specimen.

12. A robotic arm end effector apparatus movable in at least X and Z directions for transferring a semiconductor wafer from a wafer cassette, comprising:

a body having a proximal end attached to the robotic arm and an opposed distal end;

an active contact point movable between a retracted wafer-releasing position and an extended wafer-gripping position; and at least one edge sensor coupled to the body for determining an X direction position of the end effector relative to a peripheral edge of the wafer.

13. The apparatus of claim 12 in which the edge sensor includes a fiber optic light emitter closely spaced apart from a fiber optic light receiver to form therebetween a light path extending across a plane of the wafer for detecting the peripheral edge of the wafer.

14. The apparatus of claim 12 further including an elevation sensor coupled to the body for determining a Z direction position of the end effector relative to a major surface of the wafer.

15. The apparatus of claim 14 in which the elevation sensor includes a fiber optic light emitter spaced apart from a fiber optic light receiver to form therebetween a light path extending substantially parallel to a plane of the wafer for detecting the major surface of the wafer.

16. A method for retrieving from a wafer cassette a semiconductor wafer having a periphery, comprising:

prov255555ing a robotic arm with an end effector having a proximal end and an opposed distal end, the end effector movable in X and Z directions and further including at least one distal rest pad having a pad portion for supporting the edge of the wafer and a backstop portion that forms with the pad portion an included angle for gripping the edge of the wafer, and a proximal end active contact point movable between a retracted and extended positions;

retracting the active contact point;

moving the end effector an X direction distance into the cassette;

elevating the end effector in the Z direction to contact the edge of the wafer on the pad portion of the landing pad;

extending the active contact point to urge the edge of the wafer into the included angle between the pad and backstop portions of the distal rest pad, thereby gripping the wafer; and retrieving the wafer in the X direction from the cassette.

17. The method of claim 16 further including:

coupling at least one edge sensor to the end effector for determining an X position of the end effector relative to the edge of the wafer; and coupling an elevation sensor to the end effector for determining a Z position of the end effector relative to a major surface of the wafer.

18. The method of claim 17 further including:

inserting the end effector in the X direction into the cassette until at least one edge sensor detects the edge of the wafer;

recording the X position of the end effector; and computing the X distance required to move the end effector into the cassette to retrieve the wafer.

19. The method of claim 17 further including:

moving the end effector in the Z direction until the elevation sensor detects a major surface of the wafer;

recording the Z direction position of the end effector; and computing a Z direction position required for the end effector and distal rest pad to clear the major surface of the wafer.

\* \* \* \* \*

UNITED STATES PATENT AND TRADEMARK OFFICE
CERTIFICATE OF CORRECTION

PATENT NO. : 6,256,555 B1
DATED : July 3, 2001
INVENTOR(S) : Paul Bacchi and Paul S. Filipski It is certified that error appears in the above-identified patent and that said Letters Patent is hereby corrected as shown below:

<u>Title page,</u>
Item [57], ABSTRACT,
Line 8, "peripheral edge (30)" should read -- peripheral edge (18) --.

<u>Column 1,</u>
Line 66, "and," should read -- and --.

<u>Column 4,</u>
Line 6, "3/16 inch" should read -- 1/4 inch --.
Line 67, "backstop portion 36" should read -- backstop portion 34 --.

<u>Column 5,</u>
Line 19, "backstop portion 36" should read -- backstop portion 34 --.
Line 40, after "rest pads 26." insert -- Alternatively, proximal end contact point 50 is formed as part of a proximal rest pad 26. --.

<u>Column 8,</u>
Line 49, "backstop portion 136" should read -- backstop portion 134 --.

<u>Column 9,</u>
Line 3, after "rest pads 126." insert -- Alternatively, proximal end contact point 150 is formed as part of a proximal rest pad 126. --.
Line 40, "0-ring" should read -- O-ring --.
Line 65, "end effector 10" should read -- end effector 110 --.

<u>Column 10,</u>
Line 28, after "light source fiber 96" insert -- and --.

UNITED STATES PATENT AND TRADEMARK OFFICE
CERTIFICATE OF CORRECTION

PATENT NO.    : 6,256,555 B1
DATED         : July 3, 2001
INVENTOR(S)   : Paul Bacchi and Paul S. Filipski It is certified that error appears in the above-identified patent and that said Letters Patent is hereby corrected as shown below:

Column 13,
Line 14, "periphery" should read -- peripheral edge --.
Line 22, "between a" should read -- between --.
Line 28, "the pad portion of the landing pad" should read -- the pad portion of the rest pad --.

Signed and Sealed this

Eleventh Day of February, 2003

JAMES E. ROGAN
*Director of the United States Patent and Trademark Office*